US012581921B2

(12) United States Patent
Lutker-Lee et al.

(10) Patent No.: US 12,581,921 B2
(45) Date of Patent: Mar. 17, 2026

(54) MULTIPLE PATTERNING WITH SELECTIVE MANDREL FORMATION

(71) Applicant: Tokyo Electron Limited, Tokyo (JP)

(72) Inventors: Katie Lutker-Lee, Albany, NY (US); Angelique Raley, Albany, NY (US); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 329 days.

(21) Appl. No.: 17/145,500

(22) Filed: Jan. 11, 2021

(65) Prior Publication Data

US 2021/0217614 A1 Jul. 15, 2021

Related U.S. Application Data

(60) Provisional application No. 62/960,958, filed on Jan. 14, 2020.

(51) Int. Cl.
*H01L 21/027* (2006.01)
*H01L 21/033* (2006.01)
*H01L 21/311* (2006.01)
*H01L 21/3213* (2006.01)

(52) U.S. Cl.
CPC ...... *H01L 21/0274* (2013.01); *H01L 21/0271* (2013.01); *H01L 21/0332* (2013.01); *H01L 21/0337* (2013.01); *H01L 21/31144* (2013.01); *H01L 21/32137* (2013.01); *H01L 21/32139* (2013.01)

(58) Field of Classification Search
CPC ... H01L 21/0271–0274; H01L 21/0332–0337; H01L 21/31144; H01L 21/32137; H01L 21/32139
See application file for complete search history.

(56) References Cited

U.S. PATENT DOCUMENTS

| | | | |
|---|---|---|---|
| 7,141,989 B1 * | 11/2006 | Liu | H01G 5/16 324/661 |
| 9,646,845 B2 | 5/2017 | deVilliers | |
| 10,260,150 B2 | 4/2019 | Luong et al. | |
| 10,629,435 B2 | 4/2020 | Swaminathan | |
| 10,770,294 B2 | 9/2020 | O'Meara et al. | |

(Continued)

FOREIGN PATENT DOCUMENTS

| | | |
|---|---|---|
| CN | 101295643 A | 10/2008 |
| CN | 107680903 A | 2/2018 |

(Continued)

OTHER PUBLICATIONS

PCT International Search Report and Written Opinion, Application No. PCT/US2021/012883, mailed May 4, 2021, 9 pages.

(Continued)

*Primary Examiner* — Sue A Purvis
*Assistant Examiner* — Aneta B Cieslewicz
(74) *Attorney, Agent, or Firm* — Slater Matsil, LLP

(57) ABSTRACT

A method of forming a device includes forming a patterned resist layer over a substrate using an extreme ultraviolet (EUV) lithography process. The method includes forming a mandrel in a plasma processing chamber by selectively depositing a mandrel material over the patterned resist layer, the mandrel including the patterned resist layer and the mandrel material.

20 Claims, 10 Drawing Sheets

211

(56)                References Cited

U.S. PATENT DOCUMENTS

| | | | |
|---|---|---|---|
| 11,551,930 B2 | 1/2023 | Ko | |
| 2005/0202672 A1* | 9/2005 | Divakaruni | H10B 12/09 |
| | | | 438/652 |
| 2010/0261351 A1* | 10/2010 | Culp | H01L 21/31144 |
| | | | 438/694 |
| 2011/0163420 A1* | 7/2011 | Valdivia | H01L 21/0338 |
| | | | 257/E29.022 |
| 2012/0264305 A1* | 10/2012 | Nakano | H01L 21/31116 |
| | | | 438/694 |
| 2015/0155198 A1 | 6/2015 | Tsai et al. | |
| 2015/0287612 A1 | 10/2015 | Luere | |
| 2016/0247680 A1 | 8/2016 | Omeara et al. | |
| 2016/0307772 A1 | 10/2016 | Choi et al. | |
| 2016/0329207 A1* | 11/2016 | Mohanty | H01L 21/0273 |
| 2018/0158723 A1* | 6/2018 | Srivastava | G03F 7/095 |
| 2018/0239244 A1* | 8/2018 | Raley | H01L 21/3086 |
| 2019/0103272 A1* | 4/2019 | Tsai | H01L 21/0214 |
| 2019/0288084 A1* | 9/2019 | Wang | H01L 29/66795 |
| 2019/0341256 A1 | 11/2019 | Shankar et al. | |
| 2019/0348288 A1 | 11/2019 | Franke et al. | |
| 2019/0393017 A1* | 12/2019 | Kang | H01L 21/67028 |
| 2019/0393035 A1 | 12/2019 | Omeara et al. | |
| 2020/0135451 A1* | 4/2020 | Zi | G03F 7/168 |
| 2020/0272054 A1 | 8/2020 | Wada | |

FOREIGN PATENT DOCUMENTS

| | | |
|---|---|---|
| CN | 111312588 A | 6/2020 |
| EP | 2608247 A1 | 6/2013 |
| JP | 2004228376 A | 8/2004 |
| KR | 20200000378 A | 1/2020 |

OTHER PUBLICATIONS

"Multiple Patterning." Wikipedia, Wikimedia Foundation, Dec. 4, 2019, en.wikipedia.org/wiki/Multiple_patterning.

Patent Application No. 110101038, "Taiwan Office Action," dated May 31, 2024, 9 pages.

China National Intellectual Property Administration, "Notification of the First Office Action," Application No. CN202180013626.4, Feb. 28, 2025, 10 pages.

Korean Office Action, Patent Application No. 10-2022-7027536, Mailed: Jul. 15, 2025, 14 Pages.

* cited by examiner

H209          W209          207
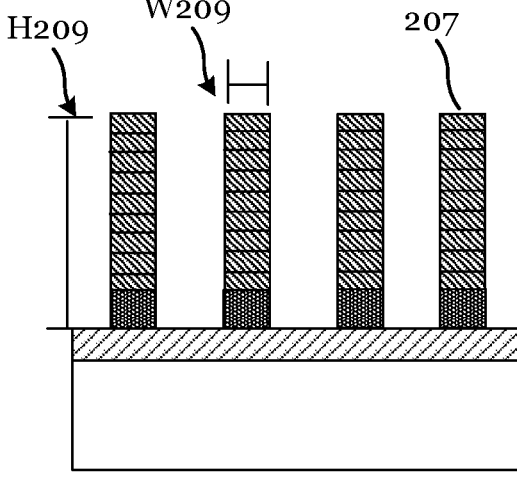
Figure 5A
207
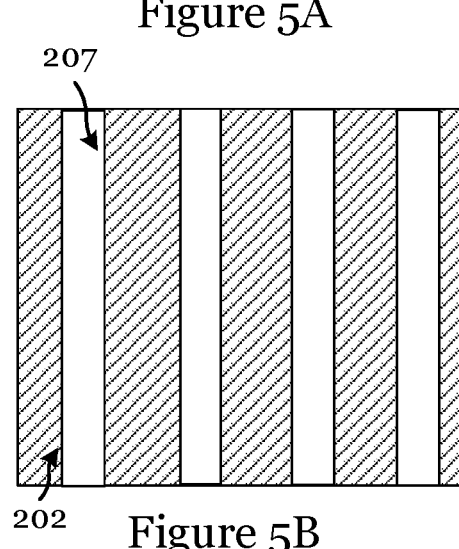
202          Figure 5B

211

207

211

300

310 — DEPOSIT A PHOTO RESIST LAYER OVER A SUBSTRATE

320 — PATTERN A PHOTO RESIST LAYER USING AN EUV LITHOGRAPHY PROCESS

330 — FORM A MANDREL OVER PATTERNED PHOTO RESIST LAYER

340 — FORM A PLURALITY OF SPACERS ON SIDEWALLS OF THE MANDREL

350 — REMOVE THE MANDREL AND LEAVE BEHIND A PLURALITY OF SPACERS

360 — USE THE PLURALITY OF SPACERS AS AN ETCH MASK TO PATTERN THE SUBSTRATE

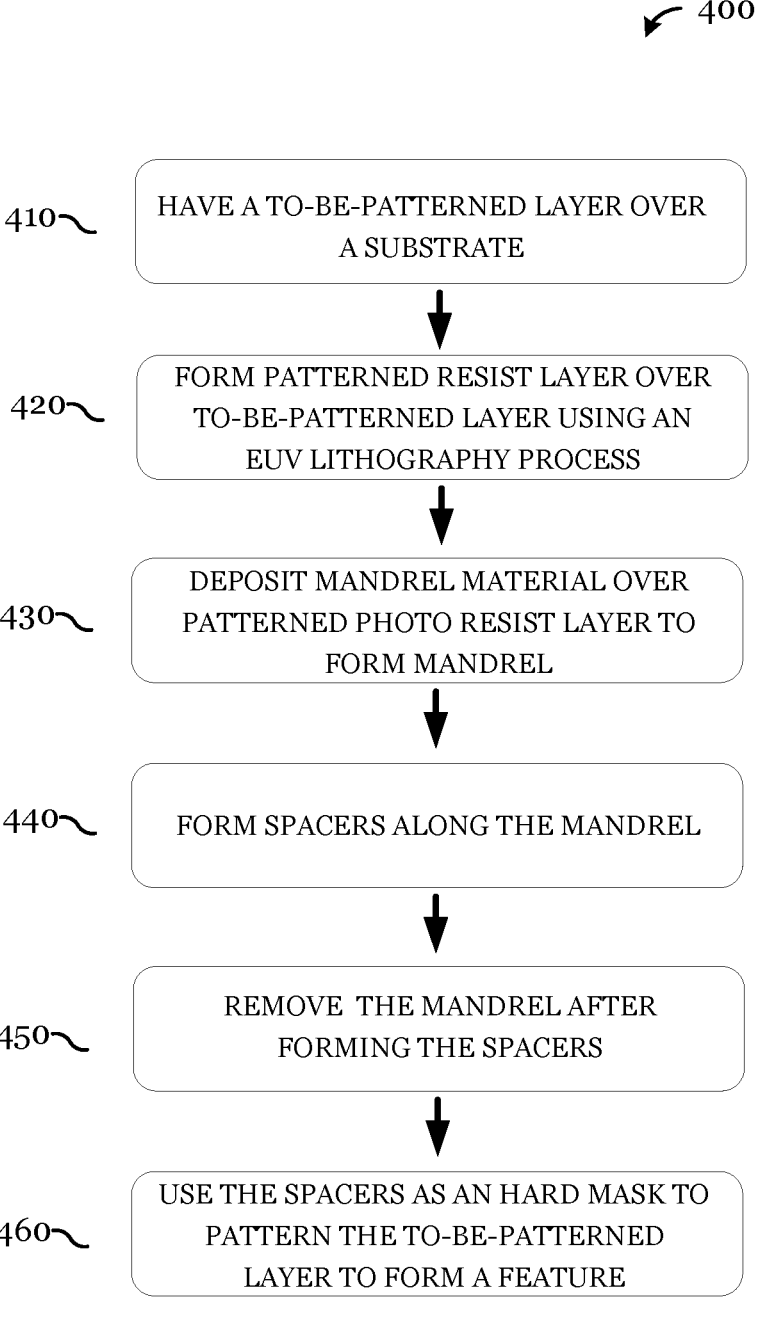

400

410 ⟶ HAVE A TO-BE-PATTERNED LAYER OVER A SUBSTRATE

420 ⟶ FORM PATTERNED RESIST LAYER OVER TO-BE-PATTERNED LAYER USING AN EUV LITHOGRAPHY PROCESS

430 ⟶ DEPOSIT MANDREL MATERIAL OVER PATTERNED PHOTO RESIST LAYER TO FORM MANDREL

440 ⟶ FORM SPACERS ALONG THE MANDREL

450 ⟶ REMOVE THE MANDREL AFTER FORMING THE SPACERS

460 ⟶ USE THE SPACERS AS AN HARD MASK TO PATTERN THE TO-BE-PATTERNED LAYER TO FORM A FEATURE

Figure 9

MULTIPLE PATTERNING WITH SELECTIVE MANDREL FORMATION

CROSS REFERENCE TO RELATED PATENTS AND APPLICATIONS

This application claims priority to and the benefit of the filing date of U.S. Provisional Patent Application No. 62/960,958, filed Jan. 14, 2020, which application is incorporated herein by reference in its entirety.

TECHNICAL FIELD

The present invention relates generally to semiconductor fabrication, and, in particular embodiments, to multiple patterning with selective mandrel formation.

BACKGROUND

Generally, semiconductor devices, such as integrated circuits (ICs) are fabricated by sequentially depositing and patterning layers of dielectric, conductive, and semiconductor materials over a semiconductor substrate using photolithography and etch to form structures for circuit components and interconnect elements (e.g., transistors, resistors, capacitors, metal lines, contacts, and vias). At each successive technology node, feature sizes are shrunk to roughly double the component packing density. A direct method for printing the higher resolution patterns is to reduce the wavelength of the light source. The 248 nm deep ultraviolet (DUV) radiation source (KrF laser), used to expose critical patterns at the 250 nm and 130 nm nodes, was replaced by the 193 nm ArF laser, starting at the 90 nm node. Features down to 35 nm may be printed using 193 nm lithography with resolution enhancement techniques, such as immersion lithography. The 193 nm optics is further extended to 14 nm and even 10 nm nodes using multiple patterning techniques, but at higher cost and processing complexity associated with the additional masks. At the sub-10 nm node regime, DUV may be replaced by the even shorter 13.5 nm wavelength extreme ultraviolet (EUV) technology. While EUV promises high resolution with fewer masks, it has to bring together all the components of a lithography system (radiation source, scanner, mask, and resist), overcoming each component's engineering hurdles. One major issue is that resists exposed with EUV radiation are sensitive to stochastic effects resulting in random failures in printing the extremely small areas and fine lines. These effects are magnified at smaller features such as sub-10 nm node designs. Further innovations are needed in this area for successful deployment of EUV lithography in high volume semiconductor IC manufacturing.

SUMMARY

In accordance with an embodiment of the present invention, a method of forming a device includes forming a patterned resist layer over a substrate using an extreme ultraviolet (EUV) lithography process. The method includes forming a mandrel in a plasma processing chamber by selectively depositing a mandrel material over the patterned resist layer, the mandrel including the patterned resist layer and the mandrel material.

In accordance with an embodiment of the present invention, a self-aligned multiple patterning process includes having a to-be-patterned layer over a substrate. The method includes forming a patterned resist layer over the to-bepatterned layer using an extreme ultraviolet (EUV) lithography process; in a plasma process chamber, selectively depositing a mandrel material over the patterned resist layer to form a mandrel. The method includes, in the plasma process chamber, forming spacers along the mandrel; in the plasma process chamber, removing the mandrel after forming the spacers, where depositing the mandrel material, forming the spacers, removing the mandrel are performed in a single process step. The method includes using the spacers as a hard mask, patterning the to-be-patterned layer to form a feature.

In accordance with an embodiment of the present invention, a self-aligned multiple patterning process includes having a to-be-patterned layer over a substrate. The method includes forming a patterned resist layer over the to-be-patterned layer using a lithography process; in a plasma process chamber, performing a cyclic process to form a mandrel including the patterned resist layer, the cyclic process including depositing a layer of a mandrel material over the patterned resist layer and the to-be-patterned layer, and performing a trim process to selectively remove portions of the layer of the mandrel material contacting the to-be-patterned layer. The method includes, in the plasma process chamber, forming spacers along the mandrel; in the plasma process chamber, removing the mandrel after forming the spacers. The method includes using the spacers as an etch mask, patterning the to-be-patterned layer to form a feature.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrate a semiconductor device during fabrication after forming a patterned resist layer 203 over a to-be-patterned layer 202, in accordance with an embodiment of the present invention, wherein FIG. 2A illustrates a cross-sectional view and FIG. 2B illustrates a top view;

FIGS. 3A and 3B illustrate a semiconductor device during fabrication after the deposition of a layer of a mandrel material 205 onto the patterned resist layer 203, in accordance with an embodiment of the present invention, wherein FIG. 3A illustrates a cross-sectional view and FIG. 3B illustrates a top view;

FIGS. 4A and 4B illustrate a semiconductor device during fabrication after trimming the layer of mandrel material, in accordance with an embodiment of the present invention, wherein FIG. 4A illustrates a cross-sectional view and FIG. 4B illustrates a top view;

FIGS. 5A and 5B illustrate a semiconductor device during fabrication after reaching the desired CD (i.e., height and width) of the mandrel, in accordance with an embodiment of the present invention, wherein FIG. 5A illustrates a cross-sectional view and FIG. 5B illustrates a top view;

FIGS. 6A and 6B illustrate a semiconductor device during fabrication after depositing a spacer material 211 over the mandrels 207, in accordance with an embodiment of the present invention, wherein FIG. 6A illustrates a cross-sectional view and FIG. 6B illustrates a top view;

FIGS. 7A and 7B illustrate a semiconductor device during fabrication after a multiple patterning process, in accordance with an embodiment of the present invention, wherein FIG. 7A illustrates a cross-sectional view and FIG. 7B illustrates a top view;

FIG. 9 illustrates a flow chart of a method for forming a semiconductor device in accordance with another embodiment of the present invention.

Figure 1A:
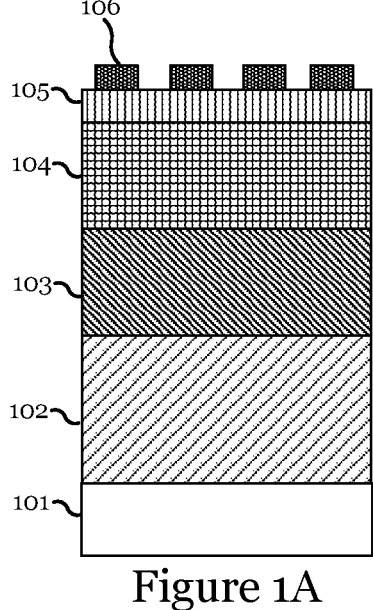
FIGS. 1A-1C illustrate cross-sectional views of a semiconductor device in accordance with a conventional process flow.

The drawings are not necessarily drawn to scale. The drawings are merely representations, not intended to portray specific parameters of the invention. The drawings are intended to depict only specific embodiments of the inventions, and therefore should not be considered as limiting in scope. In the drawings, like numbering represents like elements.

DETAILED DESCRIPTION OF ILLUSTRATIVE EMBODIMENTS

The structure, method, and using of various embodiments of an electronic device are discussed in detail below. However, it should be valued that the various embodiments detailed herein may be applicable in a wide variety of disciplines. The specific embodiments described herein are merely illustrative of specific ways to make and use various embodiments, and should not be construed in a limited scope.

In a self-aligned multiple patterning process, a mandrel is used to form sidewall spacers that are aligned to the mandrel. The sidewall spacer are then used as an etch mask to pattern an underlying layer. This enables the formation of features in the underlying layer that are thinner than the critical dimensions of the mandrel, which may be limited by the lithographic limit for that particular system. However, as further explained, the height of the mandrel determines the quality of the sidewalls spacers. If the height of the mandrel is too small, reliable sidewall spacers cannot be formed.

Embodiments of the present invention as described further below use a selective deposition process to increase the height of the mandrel. Embodiments of the present invention will be discussed using FIGS. 2A-7B and the flow charts of FIGS. 8-10.

Figure 1B:
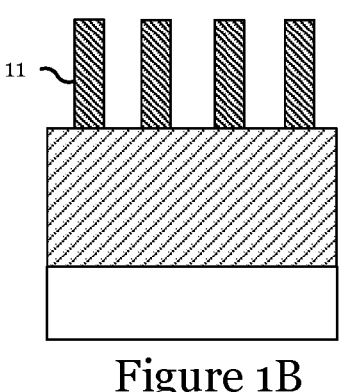
Figure 1C:
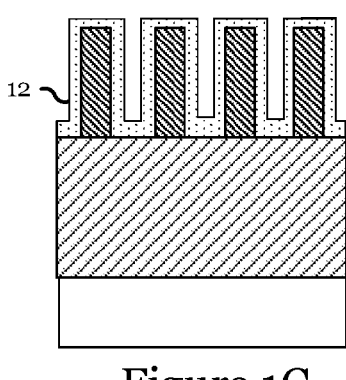

FIGS. 1A-1C illustrate cross-sectional views of a semiconductor device in accordance with a conventional process flow.

Referring to FIG. 1A, at this stage of processing, a patterned EUV photoresist layer 106 is formed over a substrate 101 having a layer stack comprising underlying layers 102, a mandrel material layer 103, an optical planarization layer (OPL) 104, and an anti-reflective coating (ARC) mask layer 105.

The shorter 13.5 nm wavelength used in EUV lithography may offer a high resolution single patterning capability, for example, printing a dense array of 13 nm resist lines and spaces (26 nm pitch) using only one mask. In contrast, two to four masks may be used to achieve an equivalent resolution with 193 nm DUV lithography using multiple patterning techniques. It is estimated that manufacturing a typical IC design at the 7 nm node would be an unacceptably long and expensive process requiring more than 80 DUV 193 nm masks, whereas EUV may bring the mask count down to a more manageable range of about 60 masks. However, EUV technology has a number of engineering difficulties arising from the high energy of photons at the short 13.5 nm wavelength, as known to persons skilled in the art. This disclosure describes embodiments of methods to mitigate some of these issues.

One issue with the 14.3 times higher energy of the EUV photon (92 eV vs. 6.4 eV) is the correspondingly lower number of photons available at a fixed exposure to define the edges of an exposed region. For example, a 1 nm$^2$ area of EUV photoresist is exposed to an average of just 10 photons for 15 mJ/cm$^2$ exposure compared to 143 photons for 193 nm DUV resist. As further explained below, this reduces the thickness of the EUV photoresist layer 106 that is formed as well as other issues such as increased shot noise.

The smaller dose may result in larger noise observed as poor quality resist patterns. This is because some regions may randomly receive more than the average number of photons while other regions may receive less. Besides, as the scanner steps from die to die, the same region on each die on the wafer may receive randomly different exposures. The random variation in the photon count, also known as shot noise, follows a Poisson process, resulting in exposure fluctuations having a percentage variation (ratio of the root mean squared value to the average value ($\sigma/\mu$)) that is $\sqrt{(14.3)}$ or about 3.8 times larger in EUV lithography relative to DUV at the same exposure level. The impact of exposure fluctuations on the exposed pattern gets aggravated as the feature sizes get smaller. The randomness in the locations where the photons interact with the resist to cause chemical reactions translates to a corresponding blurring of the edge of an exposed line. This loss of resolution is more severe for EUV (relative to DUV) because the mean distance between the locations of photon-resist interactions increases as the photon density is reduced.

Another issue associated with the high photon energy is that a photon absorption event (within the resist or a layer underlying the resist layer) is accompanied by generation of high-energy photoelectrons that quickly cascade into secondary emission of lower energy electrons. As these electrons get scattered around in a stochastic process along random trajectories, often referred to as random walk, some may cause chemical reactions in the resist considerably far from where the original photon was absorbed. As a result, there may be a random secondary exposure over a region beyond the boundaries defined by the original pattern. This secondary exposure is another stochastic process creating a random pattern superimposed on the image generated exclusively from the photon-resist interactions.

While, it is advantageous to form a EUV photoresist layer 106 that is thick, there are tradeoffs involved due to which the EUV resist films are relatively thin, as explained herein. For example, increasing the resist thickness may result in vertically non-uniform exposure that is undesirable. The radiation intensity during exposure to DUV radiation reduces progressively with penetration depth as photons get absorbed by the resist material. The progressively reducing exposure dose towards the bottom may result in an undesirably sloped resist profile, once the resist is developed. Furthermore, a thicker resist implies fewer photons reaching the bottom region, hence resulting in an undesirably amplified shot noise. The degree of vertical non-uniformity depends also on the photon absorbance of the resist material; a higher absorbance resulting in increased non-uniformity. However, because of the low number of EUV photons, the absorbance of EUV resists may be maintained high enough to provide sufficient sensitivity at a reasonable exposure dose. Excessive exposure dose may lead to various issues such as overheating and outgassing. The thickness may also be limited by resist collapse at high aspect ratios and by resist strip considerations.

The use of a thin layer of the EUV photoresist layer 106 results in limitations in the thickness of the mandrels that can be formed. This is because some of the EUV photoresist layer 106 will be etched during the subsequent etching process to pattern the mandrels.

As next illustrated in FIG. 1B, mandrels 11 are formed after performing a series of anisotropic etching processes.

Referring next to FIG. 1C, a spacer material 12 is formed along and over the mandrels 11 followed by an etching process to form sidewall spacers. The mandrel is removed and may be used to pattern the underlying layers 102. The sidewall thickness defines the critical dimension of the underlying feature being formed during a subsequent patterning step in a multiple patterning process. However, the mandrel has to be tall enough for the spacer material 12 to form a uniformly thick sidewall as illustrated in the hypothetical case in FIG. 1C. Otherwise, the thickness of the spacer material 12 varies along in the vertical direction, which would be transferred into the pattern to be formed in the underlying layers 102.

However, in practice, the short wavelength of extreme ultraviolet radiation used in forming extremely scaled features causes the height of the mandrels 11 to be limited. Consequently, sidewall spacers with uniform thickness (thickness not varying along the sidewall of the mandrels 11) cannot be formed. In addition, etch selectivity during the mandrel pull may also become an issue.

In addition, the mandrel deposition and the spacer deposition are separated by a series of process steps including deposition of upper layers for the lithography, lithography process, and subsequent etching processes. As a consequence, these steps have to be fabricated within different tools, at least different equipment chambers.

Embodiments of the present invention help to reshape the incoming resist after EUV by using a selective deposition process that improves the aspect ratio of the mandrel. Embodiments achieve these improvements by forming the mandrel directly from the photoresist instead of a conventional process that etches through a series of layers as illustrated in FIGS. 1A-1B.

FIGS. 2A-7B illustrate a semiconductor device during various stages of fabrication in accordance with an embodiment of the present invention, wherein FIGS. 2A-7A illustrate the cross-sectional views and FIGS. 2B-7B illustrate the top views.

Figures 2A, 2B:
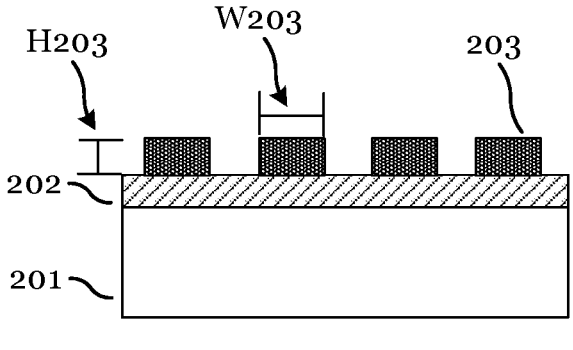

FIGS. 2A and 2B illustrate a semiconductor device during fabrication after forming a patterned resist layer 203 over a to-be-patterned layer 202, in accordance with an embodiment of the present invention, wherein FIG. 2A illustrates a cross-sectional view and FIG. 2B illustrates a top view.

Referring to FIG. 2A, the semiconductor device at this stage of processing comprises a semiconductor substrate 201, wherein a to-be-patterned layer 202 has been deposited above the semiconductor substrate 201, followed by a patterned resist layer 203 formed above the to-be-patterned layer 202. As the mandrel is being formed directly by a selective deposition instead of an etching process, some of the additional layers used, e.g., as etch stops, as illustrated in FIG. 1A may be avoided.

In an embodiment of the invention, forming the patterned resist layer 203 is a pre-cursory step to forming a mandrel, as the patterned photoresist will provide the foundational structure upon which the mandrel is grown and shaped. Details regarding this mandrel formation process as it relates to embodiments of the present invention will be described herein.

In embodiments of the invention, the semiconductor substrate 201 may comprise silicon, silicon germanium, silicon carbide, and compound semiconductors such as gallium nitride, gallium arsenide, indium arsenide, indium phosphide, and others. The semiconductor substrate 201 may comprise a semiconductor wafer that may include a semiconductor epitaxial layer including hetero epitaxial layers. For example, in one or more embodiments, one or more hetero epitaxial layers comprising a compound semiconductor may be formed over a semiconductor substrate. In various embodiments, a portion or an entirety of the semiconductor substrate 201 may be amorphous, polycrystalline, or single-crystalline. In various embodiments, the semiconductor substrate 201 may be doped, undoped, or contain both doped and undoped regions. In some embodiments, the semiconductor substrate 201 may already include previously patterned layers and the dielectric stack of the to-be-patterned layer 202.

The to-be-patterned layer 202 may be a stack of films and may comprise one or more hard mask layers. In various embodiments, the to-be-patterned layer 202 may comprise films of dielectric and/or conductive materials, such as silicon oxide, silicon nitride, silicon oxynitride, silicon carbide, titanium nitride, tantalum nitride, their alloys, and combinations thereof. In some embodiments, the to-be-patterned layer 202 may be a sacrificial layer that is removed after being used as a hard mask in a subsequent etch step. In one embodiment, the to-be-patterned layer 202 mayalso include, for example, an inter-metal dielectric (IMD) comprising a low-k dielectric material, and the semiconductor substrate 201 may include multiple interconnect levels comprising dielectric films with embedded conductive interconnect elements formed over a single crystal bulk semiconductor or semiconductor-on-insulator (SOI) wafer in which various active devices may be fabricated.

In embodiments of the invention, the to-be-patterned layer 202 may be deposited using any technique appropriate for the material to be deposited. This can include, but is not limited to, for example atomic layer deposition (ALD), chemical vapor deposition (CVD), low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), chemical oxidation, molecular beam epitaxy (MBE), plating, and/or evaporation.

In various embodiments, the patterned resist layer 203 may be formed using a EUV lithography process or e-beam lithography process.

In accordance with one or more embodiments of the invention, the patterned resist layer 203 may be formed by depositing a blanket layer of EUV-sensitive photoresist film onto a layer, such as the to-be-patterned layer 202 illustrated in FIG. 2A. In one embodiment, the EUV-sensitive photoresist film may be an organic photoresist film or a metal oxide photoresist film sensitive to EUV radiation in the wavelength range of 10 nm to about 14 nm, typically 13.5 nm.

In one or more embodiments, the EUV-sensitive photoresist film may be deposited or coated over the to-bepatterned layer 202. The blanket layer of EUV-sensitive photoresist film may be deposited to a desired height/thickness H203. In various embodiments, the height H203 of the EUV-sensitive photoresist film may be about 10 nm to about 30 nm, and about 25 nm in one embodiment. As previously discussed, the height H203 of the EUV-sensitive photoresist film is constrained by the properties of the radiation being used for developing and its interaction with the EUV-sensitive photoresist film.

The blanket layer of EUV-sensitive photoresist film is then patterned through standard EUV lithographic patterning techniques to form the patterned resist layer 203 comprising a plurality of features as illustrated in FIG. 2A. The plurality of features patterned in the EUV-sensitive photoresist film may have a desired critical dimension or width W203 for that layer, as illustrated in FIG. 2A. In various embodiments, the width W203 may be about 5 nm to about 30 nm, and about 20 nm in one embodiment. In another embodiment, the width W203 may be about 5 nm to about 15 nm, and about 10 nm in one embodiment. For example, the width W203 may be the critical dimension achievable for the EUV-sensitive photoresist film by the lithography system after developing.

In various embodiments, the ratio of the height H203 to the width W203 is about 1:1 to about 1:10. There are many reasons for why the sidewall spacer fails to deposit uniformly as the height is lowered/aspect ratio increases. Many of them relate to etching process such as selectivity, pattern collapse, pattern wiggling, and others.

This plurality of features of the patterned resist layer 203 may provide an initial base or structural foundation for subsequent growth/formation of a mandrel. Unlike conventional processes, in various embodiments, the mandrel formation process includes the lithography process followed by a selective deposition process or a cyclic deposition/trim, process as will be described further.

In the above example, the patterned resist layer 203 was described as being formed in a lithographic step of a multiple patterning technique. In other examples, the patterned resist layer 203 may be formed as a subsequent intermediate feature, e.g., formed as a consequence of pitch doubling. However, in various embodiments, the patterned resist layer 203 is a feature that has a critical dimension of the minimum feature size that is obtainable only with (directly or indirectly) a lithographic process using extreme ultraviolet (EUV) lithography or electron beam lithography.

Figure 3A:
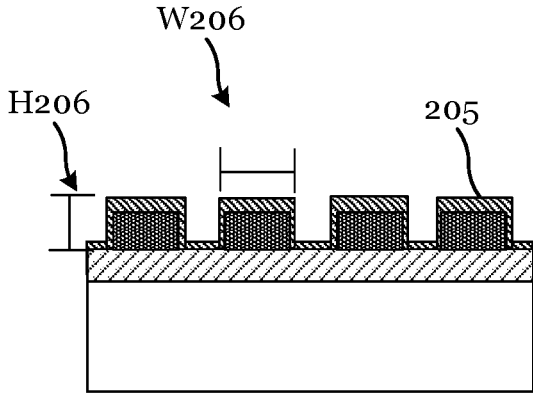
Figure 3B:
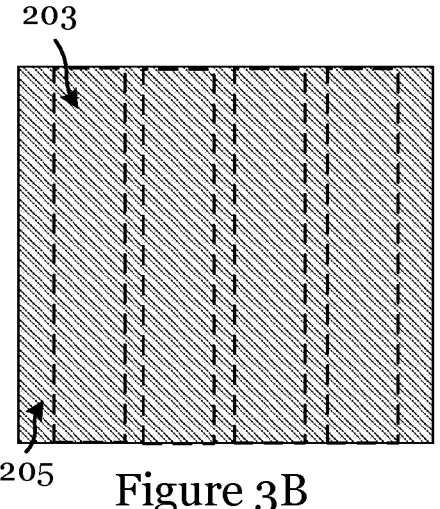

FIGS. 3A and 3B illustrate a semiconductor device during fabrication after the deposition of a layer of a mandrel material 205 onto the patterned resist layer 203, in accordance with an embodiment of the present invention, wherein FIG. 3A illustrates a cross-sectional view and FIG. 3B illustrates a top view.

Referring to FIG. 3A, in one embodiment, the mandrel material 205 is deposited over the patterned resist layer 203. The deposition process may involve a blanket deposition of the mandrel material 205 across the semiconductor substrate 201 in one embodiment.

In various embodiments, the mandrel material 205 may comprise hard mask materials, soft mask materials, or photoresist materials. In one embodiment, the mandrel material 205 comprises porous silicon, or any other type of sacrificial material known within the art. The mandrel material 205 may also compromise a plasma polymerized organic film or dielectric film.

In various embodiments, the blanket deposition may be performed using a plasma deposition process. In one embodiment, an atomic layer deposition process may be used to deposit the mandrel material 205.

Because of the blanket deposition process, the width W206 of the plurality of features increases, for a perfectly conformal process, by about twice the thickness of the layer of the mandrel material 205 formed on the sidewall of the patterned resist layer 203. The height H206 of the plurality of features increases by the thickness of the layer of the mandrel material 205 over the patterned resist layer 203.

In one or more embodiments, the mandrel material 205 may be deposited using a partially selective deposition process or a highly selective deposition process wherein more of the mandrel material 205 is deposited on the patterned resist layer 203 than on the exposed to-be-patterned layer 202. For example, in one embodiment, the mandrel material 205 has a greater selectivity towards depositing on the patterned resist layer 203, thus possessing a higher affinity to deposit mandrel material 205 more along the top surface of the patterned resist layer 203 than the top surface of the to-be-patterned layer 202.

Figure 4A:
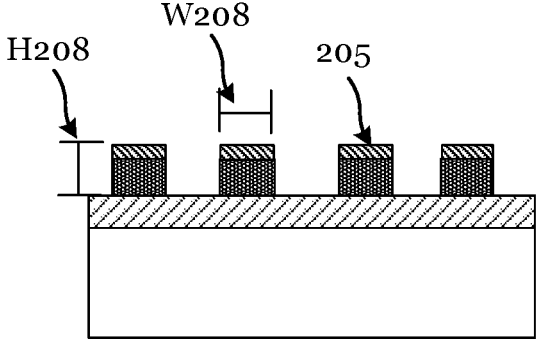
Figure 4B:
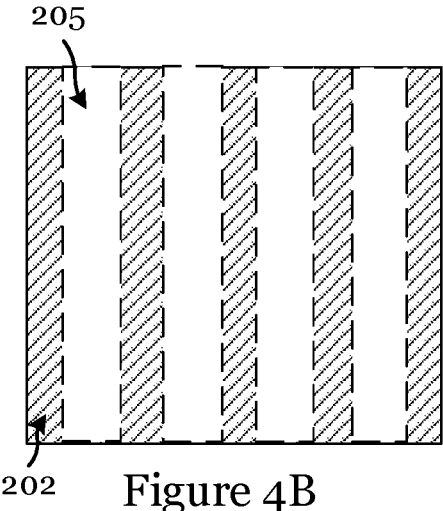

FIGS. 4A and 4B illustrate a semiconductor device during fabrication after trimming the layer of mandrel material, in accordance with an embodiment of the present invention, wherein FIG. 4A illustrates a cross-sectional view and FIG. 4B illustrates a top view.

In embodiments of the invention, the selective deposition process may optionally involve a trimming phase. The trimming phase is optional and may be used when the mandrel material 205 is deposited using a partially selective deposition process or even a conformal deposition process. Accordingly, some embodiments of the present invention may comprise a deposition phase followed by a trimming phase. The deposition phase and the trimming phase may be cycled to achieve the desired height and critical dimensions (CD).

After the trimming phase, the mandrel material 205 is removed exposing sidewalls of the patterned resist layer 203 and top surfaces of the to-be-patterned layer 202. Accordingly, advantageously, it is possible to tune the critical dimension to be the critical dimension of the mandrel being formed, or smaller/larger than the critical dimension of the mandrel being formed. For example, in one illustration, there is no increase in critical dimension of the mandrel being formed and the process maintains the critical dimension from the prior step. However, in some alternative embodiments, some of the mandrel material 205 (e.g., a thin layer of a few tenth of a nanometer) on the sidewalls of the patterned resist layer 203 may remain after the trimming phase. By removing a portion of the sidewall, embodiments of this process may help smooth the sidewalls and reduce line edge roughness and line width roughness.

When a partially selective deposition is used to form the mandrel material 205, the thickness of the mandrel material 205 on the sidewalls of the patterned resist layer 203 and over the to-be-patterned layer 202 is thinner than the thickness of the mandrel material 205 over the patterned resist layer 203. Therefore, in one embodiment, a timed isotropic etching process may be used to remove the mandrel material 205 from over the sidewalls of the patterned resist layer 203 and over the to-be-patterned layer 202.

Alternatively, the trimming phase may comprise a combination of anisotropic and isotropic etching. For example, the trimming phase may optionally begin with an isotropic etching phase before switching to an anisotropic etching.

Alternatively, in another embodiment, the trimming phase may comprise only an anisotropic etching process in which the mandrel material 205 is removed. In various embodiments of the invention, the trimming phase may comprise an anisotropic etching process, such as reactive ion etching (RIE), or any other removal process known within the art.

In various embodiments of the invention, the trimming phase may proceed after an iteration of the deposition phase. In embodiments of the invention, the deposition phase, followed by the trimming phase, may occur repeatedly in a cyclic fashion. For example, one cycle may be comprised of a single deposition phase to a designated height H206, followed by a trimming phase to a designated width, W208. The height of the mandrel being formed may be reduced to H208 due to an optional over-etch during the trimming phase. According to embodiments, when one cycle has completed, another cycle may begin until the desired final height and CD of the mandrel being formed has been reached.

According to embodiments of the invention, the trimming phase may also involve a smoothing element, such that each iterative step involves a re-shaping of the mandrel to eliminate roughness along the surfaces and edges. In embodiments of the invention, during the mandrel formation process onto the patterned resist layer 203, the critical dimension (CD), line edge roughness (LER), and line width roughness (LWR) of the incrementally forming mandrel can be simultaneously controlled. As stated earlier, this may take place within a plasma processing chamber. In various embodiments of the invention, the CD can be additionally trimmed to target the correct dimension (for instance, in efforts to counteract pitch walking). Advantageously, this trimming can occur at the same time the aspect ratio of the mandrel is being increased. Therefore, this process enables simultaneous CD control and roughness improvement of the mandrel.

FIGS. 5A and 5B illustrate a semiconductor device during fabrication after reaching the desired CD (i.e., height and width) of the mandrel, in accordance with an embodiment of the present invention, wherein FIG. 5A illustrates a cross-sectional view and FIG. 5B illustrates a top view.

As illustrated in FIG. 5A, the mandrel 207 is formed after repeating a plurality of cycles of deposition and trimming phases. In FIG. 5A, each layer from the iterative cycle (i.e., deposition and trimming phase) is depicted in the schematic by the black lines segmenting the mandrel 207.

After repeated cycling, the final CD of the mandrel 207 reaches a desired height designated by H209 and a desired width W209. In various embodiments of the invention, a ratio of a height H209 of the mandrel 207 to a width W209 of the mandrel 207 is between 10:1 to 20:1. In various embodiments of the invention, the mandrel 207 may thus be grown to a height of final height of about 30 nm to 60 nm, and in one embodiment about 40 nm to about 50 nm.

As will be clear from the fabrication process further described, the mandrel 207 is an intermediate structure used to form etch/hard masks. Additionally, mandrels 207 can be used to define the distance between adjacent features, such as etch/hard masks or other mandrels 207.

In various embodiments, the mandrel 207 may be used in a self-aligned double patterning (SADP), self-aligned quadruple patterning (SAQP), or any other multiple patterning techniques.

In addition, embodiments of the invention advantageously improve semiconductor device integration complexity by allowing the possibility for the device fabrication processing steps illustrated in FIGS. 3A to 6B to be performed in the same plasma processing chamber. Accordingly, as illustration, the mandrel 207 is formed, the spacer material 211 is deposited, then the spacer material 211 is etched, and the mandrel 207 removed all in a single plasma processing chamber. In addition to process integration improvements, there would also be an improvement in throughput time, cost, and pattern transfer performance. While the advantages mentioned herein are numerous, the selective deposition and trim process described using embodiments of this invention enables using self-aligned multi-patterning (SAMP) on EUV lithography.

As mentioned earlier, the mandrel formation process (i.e., growth and trim) and spacer deposition may be formed in a single plasma deposition process. Alternately, in some embodiments, the spacer deposition process may be performed using methods described above such as chemical vapor deposition, atomic layer deposition, and others. Therefore, in embodiments of the invention, during the deposition, different gases may be introduced to change the deposition conditions. Alternately, the process chemistry may be changed more dynamically by controlling or changing the applied bias/biasing scheme in the plasma processing chamber. As a consequence, in some embodiments, a compositional gradient may be established between the layers of the mandrel material based on properties of the etch chemistry.

In various embodiments, the processing described in FIGS. 3A-3B, and 4A-4B can be cycled to produce the features illustrated in FIGS. 5A-5B.

Although the above discussions have focused on a cyclic process comprising deposition and trim, in alternative embodiments, a single step selective deposition process may be used to directly grow a layer of the mandrel material 205. The trim phase is used because there is deposition over the to-be-patterned layer 202. In case of a partial selective deposition, a smaller number of trim cycles can be used.

Figures 6A, 6B:
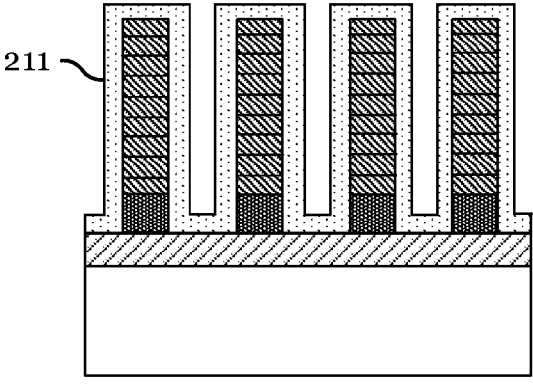

FIGS. 6A and 6B illustrate a semiconductor device during fabrication after depositing a spacer material 211 over the mandrels 207, in accordance with an embodiment of the present invention, wherein FIG. 6A illustrates a cross-sectional view and FIG. 6B illustrates a top view.

In various embodiments, the spacer material 211 may be deposited using a conformal deposition process such as atomic layer deposition (ALD) or any other conformal deposition technique used within semiconductor device fabrication. The spacer material 211 may comprise silicon oxide (SiOx), silicon nitride, titanium nitride, titanium oxide, or any other type of oxide or insulating material known within the art.

In various embodiments, the ALD fabrication step used to deposit the spacer material 211 may be a process that deposits with less aggressive oxidants (e.g., $O_3$, $H_2O$, $H_2O_2$, thermal $O_2$, and others) that do not damage the neighboring photoresist or the mandrel 207.

Figure 7A:
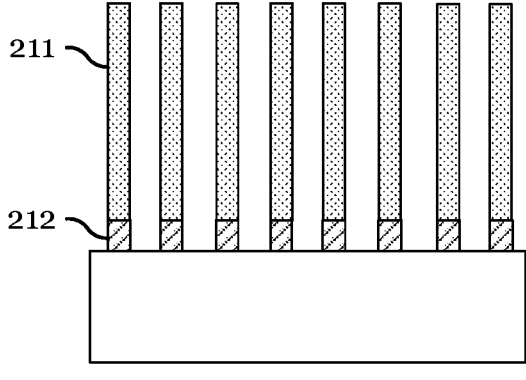
Figure 7B:
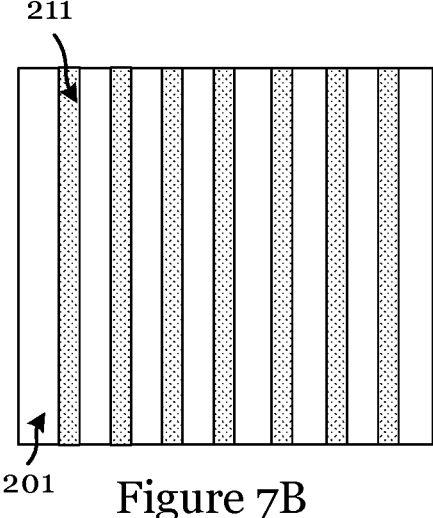

FIGS. 7A and 7B illustrate a semiconductor device during fabrication after a multiple patterning process, in accordance with an embodiment of the present invention, wherein FIG. 7A illustrates a cross-sectional view and FIG. 7B illustrates a top view.

Referring to FIG. 7A, the spacer material 211 is etched using an anisotropic etching process and the mandrel 207 is then removed to expose the underlying now patterned to-be-patterned layer 202. In various embodiments, the mandrel 207 may be removed using a wet etching process. Alternately, the mandrel 207 may be removed using an anisotropic plasma etch process, such as reactive ion etch (RIE), so that all of the etching processes may be performed in a single plasma etch chamber. The anisotropic etching process may be timed or stopped at an underlying (optional) etch stop layer. Any remaining portions of the spacer etch/hard mask may be removed after the etching.

In various embodiments of the invention, the to-be-patterned layer 202 may thus be patterned into a plurality of features 212 using the remaining spacer material 211 as an etch mask. With the mandrel 207 now removed, free standing spacers are left behind to serve as etch/hard masks to etch the underlying to-be-patterned layer 202 below the spacers. Any exposed area of the to-be-patterned layer 202 left unexposed by the spacers is removed during the etch, leaving behind a plurality of features 212.

In various embodiments, the plurality of features 212 may be formed as part of a multiple patterning process such as self-aligned double patterning (SADP), self-aligned quadruple patterning (SAQP), or any other multiple patterning techniques known within the state of the art. In various embodiments, the plurality of features 212 formed from this multiple patterning technique may be a contact hole, metal line, gate line, isolation region, and other such feature that is being formed using a self-aligned multiple patterning lithographic process.

Subsequent processing can proceed as in a conventional process flow with the formation of subsequent features and eventually the semiconductor device including all active and passive devices including metallization layers to interconnect these devices.

Advantageously, using embodiments of the present invention, a subset of the above steps may be performed in a single process recipe. Since the change from deposition to etching can be accomplished rapidly by simply changing the plasma chemistry. For example, in one embodiment, the selectively depositing of the mandrel material as illustrated in FIGS. 3A-5B, the forming the plurality of spacers as illustrated in FIGS. 6A-6B and 7A-7B, and/or removing of the mandrel as illustrated in FIGS. 7A-7B may be performed in a single process step. In further embodiments, the patterning of the to-be-patterned layer 202 as illustrated in FIGS. 7A-7B may also be part of the same process recipe and performed in the same process chamber.

As illustration, in various embodiments, the deposition of the mandrel material 205 may be performed using CxHy/N2/Ar/He/SiCl4 precursors with a trim step comprising CO2/CO/CH4/O2/N2/H2/fluorocarbon/HBr/Cl, and others. In various embodiments, the processes described above such as mandrel deposition including deposition and trim, spacer deposition, spacer etch, mandrel pull may be selected to be substantially similar for improving throughput. For example, embodiments of the invention include switching from deposition to etching by removing one of the gases and/or (simultaneously) switching the biasing scheme quickly. In one illustrative embodiment, the mandrel may be an organic material, e.g., formed using $C_xH_y$ type precursor with diluent gases such as Ar, N2, He, H2 and with trim chemistries using $C_xH_y$, CO, $CO_2$, Ar, He, N2, H2, O2 so the mandrel removal may be done by an ash chemistry such as $N_2$, $H_2$, CO2, CO, $O_2$, Ar, He type chemistries or alternatively wet chemistries.

Figure 8:
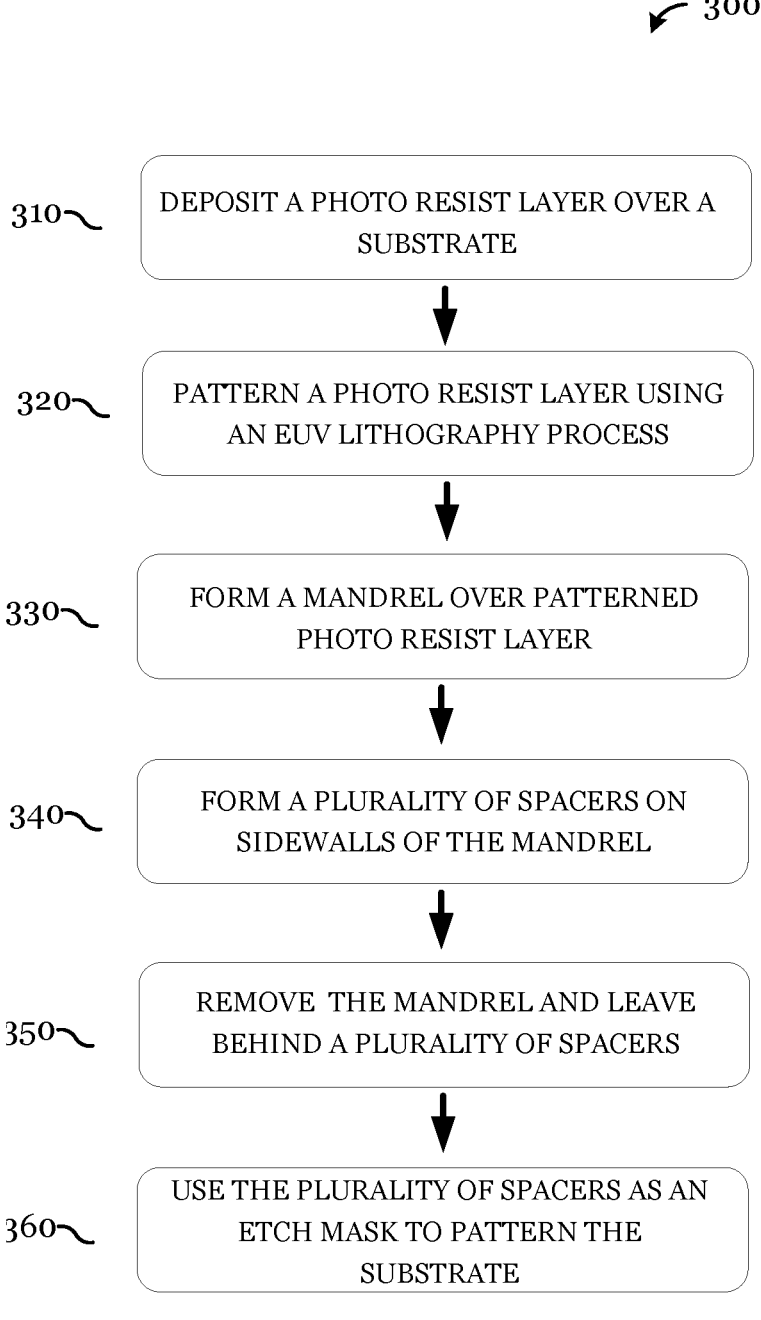
FIG. 8 illustrates a flow chart of a method for forming a semiconductor device in accordance with an embodiment of the present invention.

FIG. 8 illustrates a flow chart of a method for forming a semiconductor device in accordance with an embodiment of the present invention. The method 300 comprises depositing a photoresist layer over a substrate (box 310) and patterning a photoresist layer using an EUV lithography process (box 320) as described using, for example, FIGS. 2A-2B. Next a mandrel is formed over the patterned photo resist layer (box 330) as described using, for example, FIGS. 3A-5B. A plurality of spacers is formed on the sidewalls of the mandrel (box 340) as described using, for example, FIGS. 6A-6B.

This is followed by the removal of the mandrel, with the plurality of spacers being left behind (box 350) as described using, for example, FIGS. 7A-7B. Next the plurality of spacers is used as an etch mask to pattern a layer of the substrate (box 360) as described using, for example, FIGS. 7A-7B. In one or more embodiments, the selectively depositing the mandrel material, forming the plurality of spacers, etching back of the spacers, and removing the mandrel are performed in a single process step.

FIG. 9 illustrates a flow chart of a method for forming a semiconductor device in accordance with another embodiment of the present invention. The method 400 comprises having a to-be-patterned layer over a substrate (box 410). Next a patterned resist layer is formed over the to-be-patterned layer using an EUV lithography process (box 420) as described using, for example, FIGS. 2A-2B. Next the mandrel material is deposited over the patterned photoresist layer to form a mandrel (box 430) as described using, for example, FIGS. 3A-5B. Next, spacers are formed along the mandrel (box 440) as described using, for example, FIGS. 6A-6B. The mandrel is then removed (box 450) as described using, for example, FIGS. 7A-7B. Next the spacers can be used as a hard mask to pattern the to-be-patterned layer in order to form a feature (box 460) as described using, for example, FIGS. 7A-7B.

Figure 10:
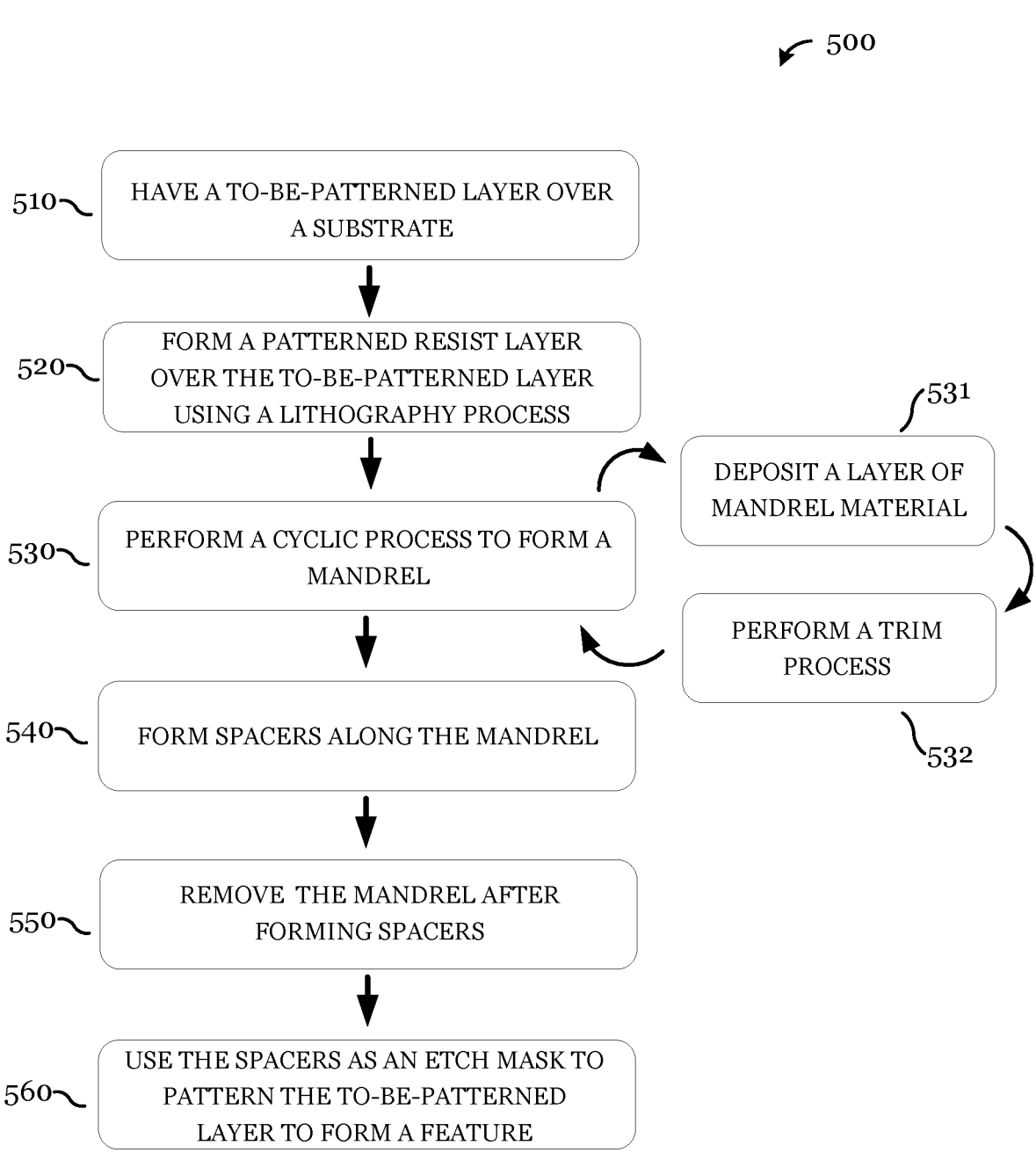
FIG. 10 illustrates a flow chart of a method for forming a semiconductor device in accordance with another embodiment of the present invention.

FIG. 10 illustrates a flow chart of a method for forming a semiconductor device in accordance with another embodiment of the present invention. The method 500 comprises having a to-be-patterned layer over a substrate (box 510). Following, a patterned resist layer is formed over the to-be-patterned layer using a lithographic process (box 520) as described using, for example, FIGS. 2A-2B. Next a cyclic process is performed to form a mandrel (box 530), the process comprising depositing a layer of mandrel material (box 531) and performing a trim process (box 532) as described using, for example, FIGS. 3A-4B. The cyclic process may comprise repeating the deposition and the performing, where the repeating may be stopped when a ratio of a height of the mandrel to a width of the mandrel is between 2:1 to 20:1. Spacers can be formed along the mandrel (box 540) as next described using, for example, FIGS. 6A-6B. After forming the spacers, the mandrel can be removed (box 550) as described using, for example, FIGS. 7A-7B. Next, the spacers can be used as an etch mask to pattern the to-be-patterned layer to form a feature (box 560) as described using, for example, FIGS. 7A-7B.

Accordingly, as described above, in conventional techniques, the photoresist is used as the sole mandrel material as the resist cannot be formed to a sufficient height. However, such techniques are not sufficient in forming deeply scaled features formed using extreme ultraviolet lithography or electron beam lithography. In order to enable spacer deposition (a subsequent semiconductor processing step typically following mandrel formation), the patterned resist has to reach a sufficient height. As previously described, the resist budget (i.e., allowable margins/limits) does not allow this height to be achieved, thus limiting or excluding the possibilities to use EUV patterned photoresist as the sole material as a mandrel. This is because the typical achievable height of an EUV photoresist is about 10 nm to about 30 nm, which is insufficient for current semiconductor fabrication needs. To enable adequate spacer deposition on the mandrel, embodiments of the present invention employ a selective mandrel growth and trim process, using the incoming resist profile as a base feature for mandrel formation. According to various embodiments of the invention, as the mandrel material is deposited onto the incoming resist profile, the mandrel material can be simultaneously re-shaped and smoothed all within the same plasma processing chamber and optionally as part of the same process.

Example embodiments of the invention are summarized here. Other embodiments can also be understood from the entirety of the specification as well as the claims filed herein.

Example 1. A method of forming a device, the method includes forming a patterned resist layer over a substrate using an extreme ultraviolet (EUV) lithography process; forming a mandrel in a plasma processing chamber by selectively depositing a mandrel material over the patterned resist layer, the mandrel including the patterned resist layer and the mandrel material.

Example 2. The method of example 1, further including: forming, in the plasma processing chamber, a plurality of spacers on sidewalls of the mandrel; in the plasma processing chamber, removing the mandrel leaving behind the plurality of spacers; and using the plurality of spacers as an etch mask, patterning a layer of the substrate to form a feature of the device.

Example 3. The method of one of examples 1 or 2, where selectively depositing the mandrel material, forming the plurality of spacers, removing the mandrel are performed in a single process step.

Example 4. The method of one of examples 1 to 3, where a ratio of a height of the mandrel to a width of the mandrel is between 2:1 to 20:1

Example 5. The method of one of examples 1 to 4, where selectively depositing the mandrel material includes: depositing a layer of the mandrel material over the substrate; and performing a trim process to selectively remove portions of the layer of the mandrel material contacting the substrate.

Example 6. The method of one of examples 1 to 5, further including repeating the depositing of the layer and the performing of the trim process.

Example 7. The method of one of examples 1 to 6, where the mandrel material includes a resist material, silicon, organic material, or dielectric material.

Example 8. The method of one of examples 1 to 7, further comprising: forming a plurality of spacers on sidewalls of the mandrel in the plasma processing chamber by depositing a layer of spacer material and anisotropically etching the layer of spacer material, or using an atomic layer deposition type process in situ in the plasma process chamber.

Example 9. The method of one of examples 1 to 8, where selectively depositing the mandrel material includes: in a single process step, depositing the mandrel material over the patterned resist layer.

Example 10. A self-aligned multiple patterning process includes having a to-be-patterned layer over a substrate; forming a patterned resist layer over the to-be-patterned layer using an extreme ultraviolet (EUV) lithography process; in a plasma process chamber, selectively depositing a mandrel material over the patterned resist layer to form a mandrel; in the plasma process chamber, forming spacers along the mandrel; in the plasma process chamber, removing the mandrel after forming the spacers, where depositing the mandrel material, forming the spacers, removing the mandrel are performed in a single process step; and using the spacers as a hard mask, patterning the to-be-patterned layer to form a feature.

Example 11. The process of example 10, where selectively depositing the mandrel material includes: depositing a layer of the mandrel material over the patterned resist layer and the to-be-patterned layer; and performing a trim process to selectively remove portions of the layer of the mandrel material contacting the to-be-patterned layer.

Example 12. The process of one of examples 10 or 11, further including repeating the depositing of the layer and the performing of the trim process.

Example 13. The process of one of examples 10 to 12, where the mandrel material includes a resist material.

Example 14. The process of one of examples 10 to 13, where the mandrel material includes silicon, organic material, or dielectric material.

Example 15. The process of one of examples 10 to 14, where forming the spacers includes: depositing a layer of spacer material and anisotropically etching the layer of spacer material.

Example 16. The process of one of examples 10 to 15, where forming the spacers includes using a fusion type process.

Example 17. A self-aligned multiple patterning process includes having a to-be-patterned layer over a substrate; forming a patterned resist layer over the to-be-patterned layer using a lithography process; in a plasma process chamber, performing a cyclic process to form a mandrel including the patterned resist layer, the cyclic process including depositing a layer of a mandrel material over the patterned resist layer and the to-be-patterned layer, and performing a trim process to selectively remove portions of the layer of the mandrel material contacting the to-be-patterned layer; in the plasma process chamber, forming spacers along the mandrel; in the plasma process chamber, removing the mandrel after forming the spacers; and using the spacers as an etch mask, patterning the to-be-patterned layer to form a feature.

Example 18. The process of example 17, where the cyclic process includes repeating the deposition and the performing, where the repeating is stopped when a ratio of a height of the mandrel to a width of the mandrel is between 2:1 to 20:1.

Example 19. The process of one of examples 17 or 18, where the cyclic process includes repeating the depositing of the layer and the performing of the trim process.

Example 20. The process of one of examples 17 to 19, where the mandrel material includes silicon, resist material, organic material, or dielectric material.

Example 21. The process of one of examples 17 to 20, where forming the spacers includes: depositing a layer of spacer material and anisotropically etching the layer of spacer material; OR using a atomic layer deposition type process in situ in the plasma process chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:

forming a patterned resist layer over a to-be-patterned layer over a substrate using an extreme ultraviolet (EUV) lithography process, the patterned resist layer comprising a metal oxide photoresist film; and performing a single process recipe in situ in a plasma chamber, wherein the single process recipe is performed by changing plasma chemistry, the single process recipe comprising:

forming a mandrel by selectively depositing a mandrel material over the patterned resist layer, the mandrel material comprising porous silicon, the mandrel comprising the patterned resist layer and the mandrel material, wherein selectively depositing the mandrel material comprises:

depositing a layer of the mandrel material over the patterned resist layer, the deposition of the layer of the mandrel material having a greater selectivity to a top surface of the metal oxide photoresist film than to the to-be-patterned layer, and performing a trim process to selectively remove portions of the layer of the mandrel material contacting the to-be-patterned layer, the trim process comprising a combination of anisotropic and isotropic etching;

forming a plurality of spacers on sidewalls of the mandrel; and removing the mandrel leaving behind the plurality of spacers.

2. The method of claim 1, further comprising, using the plurality of spacers as an etch mask, patterning the to-be-patterned layer to form a feature of the semiconductor device.

3. The method of claim 1, wherein a ratio of a height of the mandrel to a width of the mandrel is between 2:1 and 20:1.

4. The method of claim 1, further comprising repeating the depositing of the layer of the mandrel material and the performing of the trim process.

5. The method of claim 2, wherein patterning the to-be-patterned layer is performed as part of a single process step of the single process recipe.

6. The method of claim 1, wherein the patterned resist layer has a width in a range of 5 nm to 30 nm.

7. The method of claim 1, wherein the metal oxide photoresist film has a ratio of height to width in a range of 1:1 to 1:10.

8. The method of claim 1, wherein the metal oxide photoresist film is sensitive to EUV radiation in a wavelength range of 10 nm to 14 nm.

9. The method of claim 4, wherein repeating the depositing of the layer of the mandrel material and the performing of the trim process establishes a compositional gradient between layers of the mandrel material based on etch chemistry properties.

10. A self-aligned multiple patterning process comprising:

having a to-be-patterned layer over a substrate;

forming a patterned resist layer over the to-be-patterned layer using an extreme ultraviolet (EUV) lithography process;

in a plasma process chamber, selectively depositing a mandrel material over the patterned resist layer to form a mandrel, the mandrel material comprising porous silicon, wherein selectively depositing the mandrel material comprises:

depositing a layer of the mandrel material over the patterned resist layer, the deposition of the layer of the mandrel material having a greater selectivity to the patterned resist layer than to the to-be-patterned layer, and performing a trim process to selectively remove portions of the layer of the mandrel material contacting the to-be-patterned layer, wherein the trim process comprises a trimming phase, the trimming phase comprising an isotropic etching phase followed by an anisotropic etching phase;

in the plasma process chamber, forming spacers along the mandrel;

in the plasma process chamber, removing the mandrel after forming the spacers, wherein depositing the mandrel material, forming the spacers, removing the mandrel are performed in a single process step by changing chemistry of a plasma in the plasma process chamber; and using the spacers as a hard mask, patterning the to-be-patterned layer to form a feature.

11. The process of claim 10, further comprising repeating the depositing of the layer of the mandrel material and the performing of the trim process.

12. The process of claim 10, wherein forming the spacers comprises:

depositing a layer of spacer material and anisotropically etching the layer of spacer material.

13. The process of claim 10, wherein the patterned resist layer has a height in a range of 10 nm to 30 nm.

14. The process of claim 10, wherein depositing the layer of the mandrel material comprises a blanket deposition.

15. The process of claim 10, wherein depositing the layer of the mandrel material comprises an atomic layer deposition process.

16. A self-aligned multiple patterning process comprising:

having a to-be-patterned layer over a substrate;

forming a patterned resist layer over the to-be-patterned layer using a lithography process, the patterned resist layer comprising metal oxide;

in a plasma process chamber, performing a process recipe in situ by changing chemistry of a plasma, the process recipe comprising:

performing a cyclic process to form a mandrel comprising the patterned resist layer, the cyclic process comprising depositing a layer of a mandrel material over the patterned resist layer, the deposition of the mandrel material having a greater selectivity to the metal oxide than to a top surface of a material of the to-be-patterned layer, and performing a trim process to selectively remove portions of the layer of the mandrel material contacting the to-be-patterned layer, wherein the trim process comprises an isotropic etching and an anisotropic etching, and wherein the cyclic process comprises repeating the steps of depositing the layer of the mandrel material and performing the trim process, a compositional gradient being established between layers of the mandrel material based on etch chemistry properties;

forming spacers along the mandrel; and removing the mandrel after forming the spacers; and using the spacers as an etch mask, patterning the to-be-patterned layer to form a feature.

17. The process of claim 16, wherein the repeating is stopped when a ratio of a height of the mandrel to a width of the mandrel is between 2:1 and 20:1.

18. The process of claim 16, wherein the mandrel material comprises silicon, resist material, organic material, or dielectric material.

19. The process of claim 16, wherein forming the spacers comprises:

depositing a layer of spacer material and anisotropically etching the layer of spacer material; or using an atomic layer deposition process in situ in the plasma process chamber.

20. The process of claim 16, wherein the mandrel material comprises a plasma polymerized organic film.

* * * * *